United States Patent
Terashima et al.

(10) Patent No.: US 8,702,864 B2
(45) Date of Patent: Apr. 22, 2014

(54) METHOD FOR GROWING SILICON CARBIDE SINGLE CRYSTAL

(75) Inventors: Yukio Terashima, Mishima (JP); Yasuyuki Fujiwara, Shizuoka-ken (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 937 days.

(21) Appl. No.: 12/812,613

(22) PCT Filed: Jan. 14, 2009

(86) PCT No.: PCT/IB2009/000047
§ 371 (c)(1), (2), (4) Date: Jul. 13, 2010

(87) PCT Pub. No.: WO2009/090535
PCT Pub. Date: Jul. 23, 2009

(65) Prior Publication Data
US 2010/0288187 A1 Nov. 18, 2010

(30) Foreign Application Priority Data
Jan. 15, 2008 (JP) ................. 2008-005809

(51) Int. Cl.
*C30B 9/00* (2006.01)
(52) U.S. Cl.
USPC ............. 117/73; 117/54; 117/60; 117/63; 117/64; 117/67; 117/76; 117/78; 117/79
(58) Field of Classification Search
USPC .......... 117/54, 60, 63, 64, 65, 67, 73, 76, 78, 117/79
See application file for complete search history.

(56) References Cited

U.S. PATENT DOCUMENTS

2005/0183657 A1   8/2005   Kusunoki et al.

FOREIGN PATENT DOCUMENTS

| DE | 12 08 739 | 12/1963 | |
| JP | 56096799 A | * 8/1981 | ............. C30B 29/36 |
| JP | 2000-264790 | 9/2000 | |
| JP | 2002-356397 | 12/2002 | |
| JP | 2004-2173 | 1/2004 | |
| JP | 2006-143555 | 6/2006 | |
| JP | 2006-321681 | 11/2006 | |
| JP | 2007-76986 | 3/2007 | |
| WO | WO 2007/116315 A | 10/2007 | |

OTHER PUBLICATIONS

Office Action for German Pat. Appl. No. 11 2009 000 328.1 dated Jul. 6, 2011.

(Continued)

*Primary Examiner* — Matthew Song
(74) *Attorney, Agent, or Firm* — Finnegan, Henderson, Farabow, Garrett & Dunner, LLP (57) ABSTRACT

In a method for growing a silicon carbide single crystal on a silicon carbide single crystal substrate by contacting the substrate with a solution containing C prepared by dissolving C into the melt that contains Cr and X, which consists of at least one element of Ce and Nd, such that a proportion of Cr in a whole composition of the melt is in a range of 30 to 70 at. %, and a proportion of X in the whole composition of the melt is in a range of 0.5 at. % to 20 at. % in the case where X is Ce, or in a range of 1 at. % to 25 at. % in the case where X is Nd, and the silicon carbide single crystal is grown from the solution.

10 Claims, 4 Drawing Sheets

(56) References Cited

OTHER PUBLICATIONS

International Search Report in International Application No. PCT/IB2009/000047, mailed May 13, 2009.
Written Opinion of the International Searching Authority in International Application No. PCT/IB2009/000047, mailed May 13, 2009.

* cited by examiner

METHOD FOR GROWING SILICON CARBIDE SINGLE CRYSTAL

CROSS-REFERENCE TO RELATED APPLICATIONS

This application is a national phase application of International Application No. PCT/IB2009/000047, filed Jan. 14, 2009, and claims the priority of Japanese Application No. 2008-005809, filed Jan. 15, 2008, the contents of both of which are incorporated herein by reference.

BACKGROUND OF THE INVENTION

1. Field of the Invention

The invention relates to a novel method for growing silicon carbide single crystals by liquid phase deposition. More particularly, the invention is concerned with a method of growing silicon carbide single crystals by liquid phase deposition using a novel solution, which method makes it possible to reduce macro defects in the silicon carbide single crystals.

2. Description of the Related Art

Silicon carbide single crystals have excellent physical properties, such as considerably high thermal and chemical stability, high mechanical strength, high radiation hardness, higher breakdown voltage than that of Si, and high thermal conductivity. The silicon carbide single crystals to which a suitable impurity is added provide p-conductivity-type or n-conductivity-type semiconductors, which have a relatively large forbidden bandwidth (about 3.0 eV when a single crystal of 6H—SiC is used, about 3.3 eV when a single crystal of 4H—SiC is used). Accordingly, semiconductor devices using the silicon carbide single crystals can be used under high-temperature or high-frequency conditions, and offer a high withstand voltage and high resistance to harsh environments, which cannot be achieved by semiconductor devices using conventional semiconductor materials, such as silicon (Si) or gallium arsenide (GaAs). Thus, SiC (silicon carbide) has been increasingly expected as a next-generation semiconductor material.

Typical methods for growing silicon carbide single crystals include, for example, vapor phase deposition or vapor phase epitaxy (VPE), the Acheson method, and liquid phase deposition. Typical examples of the vapor phase deposition or VPE method include a sublimation process and chemical vapor deposition (CVD). In the sublimation process, various types of defects are likely to occur in the resultant crystal, and the crystal tends to be polycrystalline. The CVD method uses only gaseous sources as feed materials; therefore, the crystal formed by this method takes the form of a thin film. It is thus difficult to produce bulk single crystals by the CVD method. The Acheson method uses silica and coke as source materials, which are heated in an electric furnace; therefore, it is difficult or impossible for the resultant crystal to achieve high purity due to the presence of impurities, or the like, in the materials. In an example of method using liquid phase deposition, a silicon-containing alloy is dissolved into a melt in a graphite crucible, carbon is dissolved from the graphite crucible into the melt, and thus the melt is made a solution, so that a silicon carbide crystal layer is deposited and thus grown on a single crystal substrate placed in a low-temperature portion of the solution. Although silicon carbide single crystals are grown at a low rate by liquid phase deposition, in other words, liquid-phase production of silicon carbide single crystals suffers from a low growth rate, it is an advantageous method for obtaining bulk single crystals. Thus, various studies have been made in recent times, in an attempt to increase the growth rate in the growth of silicon carbide single crystals by liquid phase deposition, which does not suffer from the above-described problems as encountered in the vapor phase deposition and Acheson method.

In a method for producing a silicon carbide single crystal as described in JP-A-2000-264790, a source material containing at least one element selected from transition metals, Si and C (carbon) is dissolved into a melt (i.e., C (carbon) is dissolved into the melt which is a solvent containing the at least one element selected from transition metals and Si), with which a silicon carbide seed crystal in the form of a single crystal is brought into contact, and the solution is cooled into a condition where the temperature of the solution is lower than the liquidus line of the solution, so that a silicon carbide single crystal is deposited and grown on the seed crystal. While the transition metals listed by way of example in this publication are Fe, Co, Ni (which belong to the VIII group), Ti, Zr, Hf (which belong to the IVb group), V, Nb, Ta (which belong to the Vb group), and Cr, Mo, W (which belong to the VIb group), only the compositions of the materials containing Mo, Cr, or Co as a transition metal are specifically disclosed. In this publication, there are no disclosure of a method or means for measuring and evaluating the quality of the deposited single crystal, and no description of macro defects formed on a growth surface of the grown crystal.

JP-A-2004-2173 discloses a melt of an alloy containing Si, C and M (M: Mn or Ti) in which, where the atomic ratio of Si and M is represented by $Si_{1-X}M_X$, $0.1 \leq X \leq 0.7$ when M is Mn, and $0.1 \leq X \leq 0.25$ when M is Ti. The melt does not contain undissolved C. C is dissolved into the melt from a graphite crucible. In a method for producing silicon carbide single crystal as described in JP-A-2004-2173, a substrate of a silicon carbide seed crystal is dipped into the solution, and the alloy melt around the seed crystal substrate is supercooled so that the solution is supersaturated with silicon carbide, whereby a silicon carbide single crystal is grown on the seed crystal substrate. With regard to the method for producing a silicon carbide single crystal as described in JP-A-2000-264790 identified above, it is stated in JP-A-2004-2173 that the silicon carbide produced by this method is likely to be polycrystalline because of the inclusion of carbon in the source material.

JP-A-2006-143555 discloses a melt (a solution containing C) of an alloy containing Si, C and M (M: Fe or Co) in which, where [M] is the molar concentration of M and [Si] is the molar concentration of Si, a value of [M]/([M]+[Si]) is equal to or larger than 0.2 and equal to or smaller than 0.7 when M is Fe, and is equal to or larger than 0.05 and equal to or smaller than 0.25 when M is Co. In a method for producing a silicon carbide single crystal as described in JP-A-2006-143555, a seed crystal substrate made of silicon carbide is dipped into the melt of the alloy (the solution containing C), and the alloy melt around the seed crystal substrate is supersaturated with silicon carbide, whereby a silicon carbide single crystal is grown on the seed crystal substrate. This publication, however, has no description of micro defects on a growth surface of the crystal.

JP-A-2007-76986 discloses a solution that contains a melt that includes Si, Ti, M (M: Co and/or Mn) as a solvent and C as a solute, and satisfies the relationships of $0.17 \leq y/x \leq 0.33$ and $0.90 \leq (y+x)/x \leq 1.80$ where the atomic ratio of Si, Ti and M is represented by $Si_x Ti_y M_z$, and a solution that contains Si, Ti, M (M: Al) and C, and satisfies the relationships of $0.17 \leq y/x \leq 0.33$ and $0.33 \leq (y+z)/x \leq 0.60$ where the atomic ratio of Si, Ti and M is represented by $Si_x Ti_y M_z$. In a method for producing a silicon carbide single crystal as described in JP-A-2007-76986, a seed crystal substrate for use in the growth of silicon carbide is brought into contact with the former solution or the latter solution as indicated above, and the solution around the seed crystal substrate is supercooled so as to be supersaturated with silicon carbide dissolved in the solution, whereby a silicon carbide single crystal is grown on the seed crystal substrate. This publication, however, has no description of macro defects on a growth surface of the crystal.

As described above, there is no description of macro defects on growth surfaces of the crystals, in the above-identified publications describing the methods for growing silicon carbide bulk single crystals by liquid phase deposition, and it has been difficult to achieve an improvement in the morphology of surfaces of crystal growth layers.

SUMMARY OF THE INVENTION

Having conducted researches or studies to develop a method for producing silicon carbide single crystals at a high growth rate by liquid phase deposition, the inventors found that a relatively high growth rate is achieved by addition of a certain amount or more of Cr in a Si—Cr—C solution, but macro defects, such as voids or inclusions of the solution, are present inside a growth layer of the resultant silicon carbide single crystal. The present invention provides a method for growing a silicon carbide single crystal by liquid phase deposition, which makes it possible to reduce macro defects in the silicon carbide single crystal, which would occur due to the use of the Si—Cr—C solution.

First aspect of the invention is concerned with a method for growing a silicon carbide single crystal on a silicon carbide single crystal substrate by contacting the substrate with a solution containing C prepared by heating and melting Si in a graphite crucible, and dissolving C into a melt containing Si from the graphite crucible. In this method, the solution containing C is prepared by dissolving C into the melt that contains Cr and X, which consists of at least one element of Ce and Nd, such that a proportion of Cr in a whole composition of the melt is in a range of 30 to 70 at. %, and a proportion of X in the whole composition of the melt is in a range of 0.5 at. % to 20 at. % in the case where X is Ce, or in a range of 1 at. % to 25 at. % in the case where X is Nd, and the silicon carbide single crystal is grown from the solution.

Second aspect of the invention is also concerned with a method for growing a silicon carbide single crystal. In this method, a solution containing C is prepared by dissolving C into a melt containing Si, Cr and X which is at least one element of Ce and Nd in a crucible while heating the crucible, and a silicon carbide single crystal substrate is brought into contact with the solution so as to grow the silicon carbide single crystal on the silicon carbide single crystal substrate. In this method, a proportion of Cr in the whole composition of the melt is in a range of 30 to 70 at. %, and a proportion of X in the whole composition of the melt is in a range of 0.5 at. % to 20 at. % in the case where X is Ce, in a range of 1 at. % to 25 at. % in the case where X is Nd, or in a range of 0.5 at. % to 25 at. % in the case where X is Ce and Nd.

According to the above first aspect and second aspect of the invention, it is possible to produce a silicon carbide single crystal while reducing macro defects that would appear in silicon carbide signal crystals formed from a Si—Cr—C solution by liquid phase deposition.

In the method according to the above first aspect of the invention, the proportion of X in the whole composition of the melt may be in a range of 1 at. % to 20 at. %, or may be in a range of 1 at. % to 10 at. %.

Since the surface tension and surface energy of the solution decrease and the stability of the behavior of the solution deteriorates as the amount of X increases, the proportion of X is preferably controlled to be within the range of 1 at. % to 20 at. %, more preferably, within the range of 1 at. % to 10 at. %, to provide the Si—Cr—X—C solution for use in the growth of the silicon carbide crystal. X may consist of both Ce and Nd.

With regard to the proportion of Cr in the Si—Cr—C solution, the amount of deposition of the silicon carbide single crystal is considerably reduced if Cr is less than 30 at. %, and polycrystals are likely to be formed around the silicon carbide single crystal if Cr is larger than 70 at. %, which makes it difficult to stably grow a crystal that consists solely of a single crystal. Thus, the proportion of Cr in the Si—Cr—X—C solution is appropriately controlled to be within the range of 30 at. % to 70 at. %. Also, if the proportion of X in the Si—Cr—X—C solution is less than the lower limit of the above-indicated range for each of Ce and Nd, macro defects in the resultant silicon carbide single crystal are less effectively reduced. If the proportion of X in the Si—Cr—X—C solution is larger than the upper limit of the above-indicated range for each of Ce and Nd, a part of or the whole of the resultant silicon carbide crystal is made polycrystalline, and stable growth of a single crystal is less likely to be achieved.

BRIEF DESCRIPTION OF THE DRAWINGS

The foregoing and further objects, features and advantages of the invention will become apparent from the following description of example embodiments with reference to the accompanying drawings, wherein like numerals are used to represent like elements and wherein.

DETAILED DESCRIPTION OF THE PREFERRED EMBODIMENTS

Figure 1:
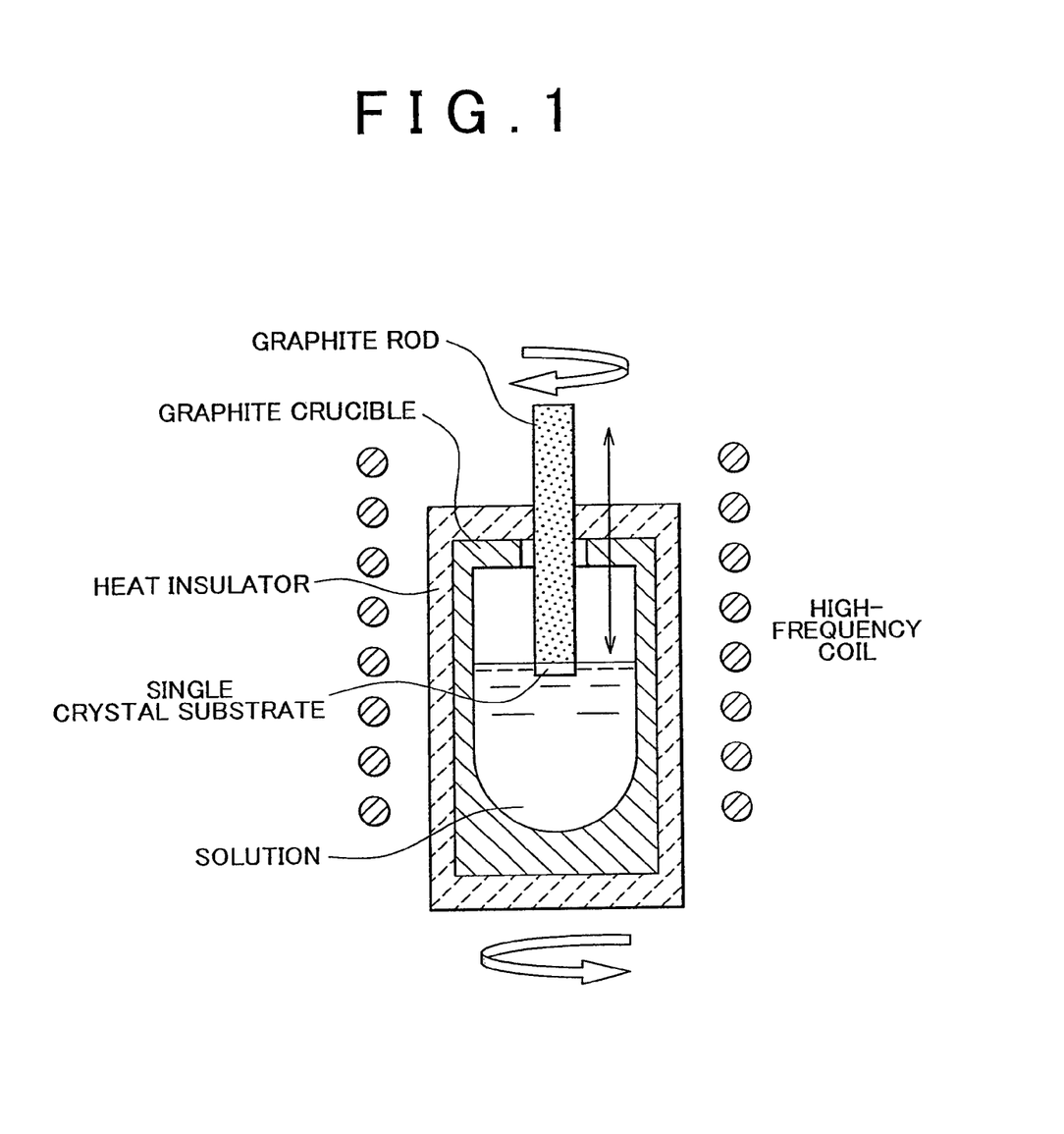
FIG. 1 shows an example of production apparatus for use in practicing a method of this invention.

An embodiment of the invention will be described with reference to FIG. 1. In FIG. 1, a single crystal substrate consisting of silicon carbide is bonded and fixed to a tip of a graphite rod (which may also be called "graphite shaft") as one example of support member for the silicon carbide single crystal substrate. A method of the embodiment of the invention as described below is implemented by dipping the graphite rod into a solution such that C is dissolved into a melt heated by high-frequency coils serving as a heating device, so that a silicon carbide single crystal is grown on the single crystal substrate.

If a Si—Cr—X melt having a composition according to the method of this embodiment is used as the melt, the growth rate of the silicon carbide single crystal is kept relatively high, and macro defects in the silicon carbide single crystal are reduced. However, the use of only a Si—Cr—C solution or a Si—Cr—C solution to which another element is added results in voids or involvements of the solution in the interior of the crystal. Such macro defects in the crystal can be reduced by adding X (Ce, Nd) to the Si—Cr—C solution, preferably, by simultaneously adding Cr and X to the solution. Similarly, macro defects in the crystal can be reduced by adding X, or simultaneously adding X and another element, to a solution of, preferably, Si—Cr—Ni—C, Si—Cr—Co—C, or the like, other than the above-indicated four-component system. For example, Cr and X may be simultaneously added in the Si—Cr—Ni—X—C or Si—Cr—Co—X—C solution. On the other hand, no advantageous effect is recognized in addition of X to a Si—Ti—Al—C solution.

A method for preparing a Si—Cr—X—C solution having a composition according to the method of this embodiment for production of silicon carbide single crystals is not limited to any particular method. For example, Si, Cr and X are initially added as a source material into a graphite crucible serving as a reactor, and a melt is formed by melting the source material into to form an alloy and heating the alloy to a temperature higher than the solidus line of the alloy, whereby C is dissolved into the melt, and Si—Cr—X—C solution is formed. At least a part of C in the solution is dissolved from the graphite crucible into the melt. While it is particularly preferable that the whole of C is supplied through dissolution from the graphite crucible, a part of C may be supplied in the form of a carbide or carbon contained in the source material of the solution, or a part of C may be supplied by blowing a carbon-containing gas, such as methane gas, into the melt or the solution.

As the melt is kept heated, the source material consisting of Si, Cr and X is sufficiently molten, and C is sufficiently dissolved from the graphite crucible, so that the concentration of carbon in the resultant solution reaches a level close to the saturation concentration of silicon carbide in the melt as a solvent, and becomes constant. Then, a single crystal substrate used for the growth of silicon carbide is brought into contact with the solution, and the solution around the single crystal substrate is supercooled to a temperature of 2100° C. or lower, in particular, a temperature of about 1600-1800° C., by a temperature gradient method by which the solution has a temperature gradient of about 5-50° C./cm, or a cooling method of cooling the solution by controlling the operation of the heating device. As a result, the solution is supersaturated with silicon carbide dissolved therein, so that a silicon carbide single crystal is grown on the single crystal substrate. As the above-mentioned single crystal substrate, a substrate having the same crystal form as that of silicon carbide to be grown is preferably used. For example, a single crystal of silicon carbide produced by a sublimation process may be used.

In the method of this embodiment, known conditions or parameters, such as the shape of the graphite crucible, a heating method, a heating period of time, an atmosphere, the rate of increase of the temperature and the rate of cooling, of conventional production methods using liquid phase deposition may be employed. For example, high-frequency induction heating may be used as the heating method. The heating period (i.e., an approximate period of time from introduction of the source material to the time when the melt reaches the silicon carbide saturation concentration) may be about several hours to 10 hours (e.g., about 3 to 7 hours), though it depends on the size of the crucible. The atmosphere may be selected from rare gases, such as inert gases like He, Ne and Ar, and gases obtained by replacing part of the inert gas with $N_2$ or methane gas.

According to the method of this embodiment, silicon carbide single crystals that are substantially free from polycrystals, preferably, n-type silicon carbide single crystals, can be produced at substantially the same or higher rate of growth, as compared with known methods for growing silicon carbide single crystals by liquid phase deposition using a known three-component system (for example, Si—Cr—C solution) or four-component system (for example, Si—Ti—Al—C solution, Si—Ti—Mn—C solution, or Si—Ti—Co—C solution). Furthermore, according to the method of the embodiment, silicon carbide single crystals having reduced macro defects in the crystals can be produced.

In the following, some examples of the invention, along with comparative examples, will be explained. In each of the following examples, an experiment on the growth of a silicon carbide single crystal was conducted using an apparatus including the graphite crucible shown in FIG. 1 as a reactor. In each of the examples of the invention, Si was added to the graphite crucible, and Cr and X were then added at the same time into the graphite crucible. After the source material of Si, Cr and X was kept heated for about 2 to 3 hours and maintained at a set temperature (1800-2100° C.), a silicon carbide single crystal substrate was dipped into a solution into which C was dissolved from the graphite crucible so that it reached the silicon carbide saturation concentration. After the solution was kept at the set temperature, high-frequency coils serving as a heating device were controlled so as to provide the single crystal substrate and the front surface of the crystal under growth with a temperature gradient of 0.8-3.0° C./mm, so that silicon carbide derived from the solution was grown on the single crystal substrate. After a lapse of a predetermined time for the growth, the grown crystal was completely pulled out of the solution, and the crucible was gradually cooled down to the room temperature. In this manner, a grown silicon carbide single crystal was obtained. A cross section of the silicon carbide crystal obtained in each of the examples of the invention was observed with a microscope or SEM, for evaluation of macro defects in the crystal. It was confirmed, by means of X rays (XRD), whether the silicon carbide crystal obtained in each examples was a single crystal or a polycrystal.

Comparative Example 1

Figure 2:
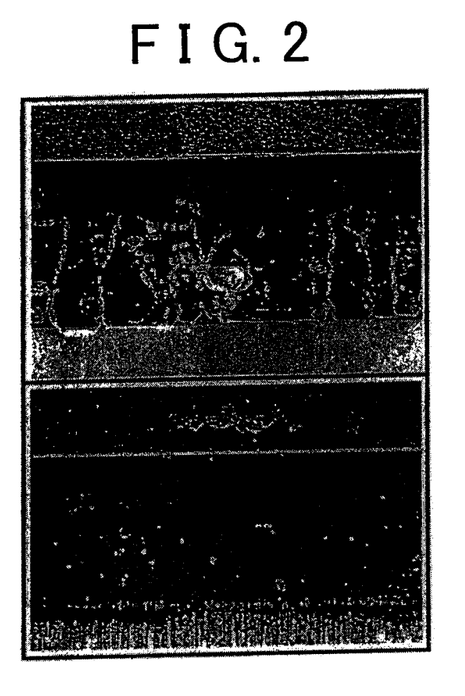
FIG. 2 has the upper view showing a cross section of a silicon carbide crystal obtained in Comparative Example 1, and the lower view showing a cross section of a silicon carbide crystal obtained in Comparative Example 2.

A source material composed of Si and Cr in proportions of 50 at. % (Si) and 50 at. % (Cr) was added into a graphite crucible, into which neither Ce nor Nd was added, and the material was heated and molten into a solution. The solution was kept at a certain temperature, and a seed crystal was dipped into the solution, to permit growth of a crystal on the seed crystal. The resultant silicon carbide crystal was confirmed to be a single crystal. The temperature of the solution, etc. was measured with a radiation thermometer and a thermocouple. The radiation thermometer was installed at an observation window that is located above a surface of the solution to permit direct observation of the solution surface, and was able to measure temperatures before and after contacting of the seed crystal with the solution. Also, the thermocouple was installed at the tip of the graphite rod to which the single crystal substrate was bonded (e.g., at a position 2 mm apart from the seed crystal on the single crystal substrate), and measured the temperature from the time immediately after contacting of the seed crystal with the solution. A result of observation of a cross section of the resultant silicon carbide crystal is shown in FIG. 2 (the upper view). It is understood from FIG. 2 that if the Si—Cr—C solution is used, macro defects are observed in the resultant silicon carbide single crystal. A table below indicates the amount of deposition (represented by the growth rate) when the proportions of Si and Cr were varied to form some examples of single crystals. When the proportion of Cr was larger than 70 at. %, the result of observation of the obtained silicon carbide crystal cross section revealed that polycrystals were seen around the silicon carbide single crystal or over the entire area of the cross section. When the proportion of Cr was smaller than 30 at. %, on the other hand, the amount of deposition of the silicon carbide single crystal was reduced as compared with the compositions having other proportions.

Figure 4:
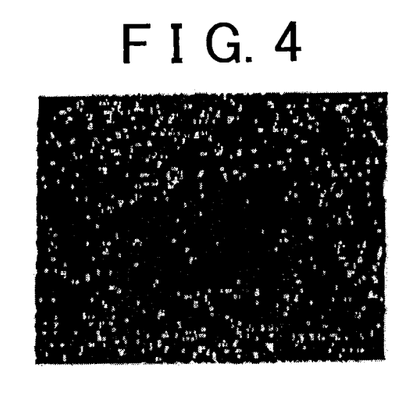
FIG. 4 is a view showing a cross section of a silicon carbide single crystal obtained from a Si—Cr—C solution of Comparative Example 1, under a condition that the proportion of Cr in the sum of Si and Cr is 90 at. %.

| Proportion of Cr (at. %) | Growth Rate (μm/h) | Notes |
|---|---|---|
| 3 | 0 | |
| 5 | 5 | |
| 10 | 5 | |
| 15 | 3 | |
| 20 | 27 | |
| 25 | 45 | |
| 30 | 160 | |
| 40 | 250 | |
| 50 | 300 | |
| 60 | 350 | |
| 70 | 310 | |
| 80 | 270 | |
| 90 | 180 | The single crystal cross section is shown in FIG. 4 |

Comparative Example 2

A source material composed of Si, Cr and Sn in proportions of 48 at. % (Si), 47 at. % (Cr) and 5 at. % (Sn) was added into a graphite crucible, and was heated and molten. The solution was kept at a certain temperature, and a single crystal substrate was dipped into the solution to permit growth of a crystal on the substrate, in the same manner as in Comparative Example 1. The resultant silicon carbide crystal was confirmed to be a single crystal. A result of observation of a cross section of the silicon carbide crystal is shown in FIG. 2 (the lower view). Namely, the upper view of FIG. 2 shows the crystal formed from the solution of Si—Cr—C, and the lower view shows the crystal formed from the solution of Si—Cr—Sn—C. It is understood from FIG. 2 that if a sulution other than Ce and Nd is added to the Si—Cr—C solution to provide a solution that forms a single crystal, a relatively small number of macro defects are observed in the silicon carbide single crystal.

Example 1

Figure 3:
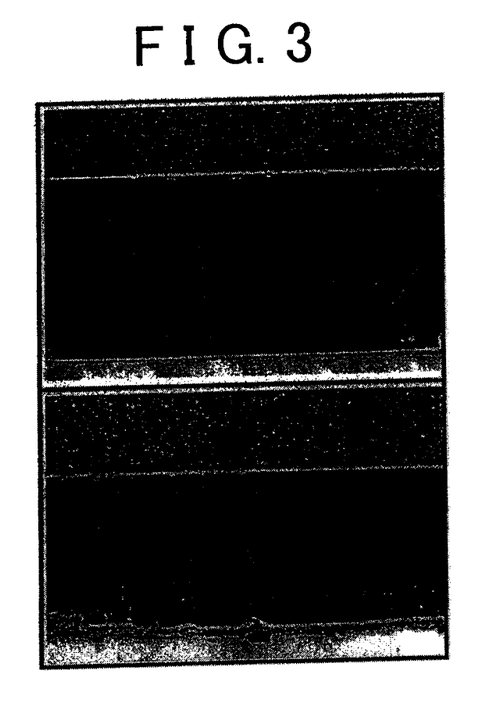
FIG. 3 has the upper view showing a cross section of a silicon carbide crystal obtained in Example 1, and the lower view showing a cross section of a silicon carbide crystal obtained in Example 2.

A source material composed of Si, Cr and Ce in proportions of 50 at. % (Si), 45 at. % (Cr) and 5 at. % (Ce) was added into a graphite crucible, and was heated and molten. The solution was kept at a certain temperature, and a single crystal substrate was dipped into the solution to permit growth of a crystal on the substrate. The resultant silicon carbide crystal was confirmed to be a single crystal. The measurement of the temperature of the solution, etc., observation of a cross section of the silicon carbide single crystal, and the measurement of the growth rate of the silicon carbide single crystal were conducted in the same manners as in Comparative Example 1. A cross section of the crystal is shown in FIG. 3 (the upper view). It is confirmed from FIG. 3 that the use of the Si—Cr—Ce—C solution results in a remarkable reduction of macro defects in the silicon carbide single crystal.

Example 2

A source material composed of Si, Cr and Nd in proportions of 50 at. % (Si), 45 at. % (Cr) and 5 at. % (Nd) was added into a graphite crucible, and was heated and molten. The solution was kept at a certain temperature, and a single crystal substrate was dipped into the solution to permit growth of a crystal on the substrate. The resultant silicon carbide crystal was confirmed to be a single crystal. The measurement of the temperature of the solution, etc., observation of a cross section of the silicon carbide single crystal, and the measurement of the growth rate of the silicon carbide single crystal were conducted in the same manners as in Comparative Example 1. A cross section of the crystal is shown in FIG. 3 (the lower view). It is confirmed from FIG. 3 that the use of the Si—Cr—Nd—C solution results in a remarkable reduction of macro defects in the silicon carbide single crystal.

Examples 3-9

Silicon carbide crystals of Examples 3-9 of the invention were obtained through crystal growth in the same manner as in Example 1, except that the proportions of Si, Cr and Ce in the composition of the source material added into the graphite crucible were varied as indicated in TABLE 1 below. An effect of addition of Ce in each example was determined in the same manner as in Example 1. The results regarding Examples 3-9 are shown in TABLE 1 below.

Comparative Examples 3-6

Silicon carbide crystals of Comparative Examples 3-6 were obtained through crystal growth in the same manner as in Example 1, except that the proportions of Si, Cr and Ce in the composition of the source material added into the graphite crucible were varied to be different from those of Examples 3-9 as indicated in TABLE 1 below. An effect of addition of Ce in each example was determined in the same manner as in Example 1. The results regarding Comparative Examples 3-6 are shown in TABLE 1 below.

TABLE 1

| | Ex. or Com. Ex. No. | | | | | | | | | | |
|---|---|---|---|---|---|---|---|---|---|---|---|
| | Com. 3 | Ex. 3 | Ex. 4 | Ex. 5 | Ex. 6 | Ex. 7 | Ex. 8 | Ex. 9 | Com. 4 | Com. 5 | Com. 6 |
| Proportion of Added Element Ce (at. %) | 0.2 | 0.5 | 1 | 3 | 5 | 7 | 10 | 20 | 23 | 25 | 30 |
| Proportion of Added Element Si (at. %) | 50 | 50 | 50 | 49 | 48 | 48 | 45 | 40 | 39 | 38 | 32 |
| Proportion of Added Element Cr (at. %) | 49.8 | 49.5 | 49 | 48 | 47 | 45 | 45 | 40 | 38 | 37 | 28 |

TABLE 1-continued

| | Ex. or Com. Ex. No. | | | | | | | | | | |
|---|---|---|---|---|---|---|---|---|---|---|---|
| | Com. 3 | Ex. 3 | Ex. 4 | Ex. 5 | Ex. 6 | Ex. 7 | Ex. 8 | Ex. 9 | Com. 4 | Com. 5 | Com. 6 |
| Result of Observation of Single Crystal Cross Section | $x^1$ | Δ | o | o | o | o | o | o | $x^2$ | $x^2$ | $x^2$ |

$x^1$: Macro defects were observed in the signal crystal.
$x^2$: The crystal was made polycrystalline.
Δ: Macro defects in the single crystal did not completely disappear, but a certain effect of reducing defects was observed.
o: Macro defects in the single crystal disappeared.

Examples 10-17

Silicon carbide crystals of Examples 10-17 of the invention were obtained through crystal growth in the same manner as in Example 2, except that the proportions of Si, Cr and Nd in the composition of the source material added into the graphite crucible were varied as indicated in TABLE 2 below. An effect of addition of Nd in each example was determined in the same manner as in Example 2. The results regarding Examples 10-17 are shown in TABLE 2 below.

Comparative Examples 7-9

Silicon carbide crystals of Comparative Examples 7-9 were obtained through crystal growth in the same manner as in Example 2, except that the proportions of Si, Cr and Nd in the composition of the source material added into the graphite crucible were varied to be different from those of Examples 10-17, as indicated in TABLE 2 below. An effect of addition of Nd in each example was determined in the same manner as in Example 2. The results regarding Comparative Examples 7-9 are shown in TABLE 2 below.

TABLE 2

| | Ex. or Com. Ex. No. | | | | | | | | | | |
|---|---|---|---|---|---|---|---|---|---|---|---|
| | Com. 7 | Com. 8 | Ex. 10 | Ex. 11 | Ex. 12 | Ex. 13 | Ex. 14 | Ex. 15 | Ex. 16 | Ex. 17 | Com. 9 |
| Proportion of Added Element Nd (at. %) | 0.2 | 0.5 | 1 | 3 | 5 | 7 | 10 | 20 | 23 | 25 | 30 |
| Proportion of Added Element Si (at. %) | 50 | 50 | 50 | 49 | 48 | 48 | 45 | 40 | 39 | 38 | 32 |
| Proportion of Added Element Cr (at. %) | 49.8 | 49.5 | 49 | 48 | 47 | 45 | 45 | 40 | 38 | 37 | 28 |
| Result of Observation of Single Crystal Cross Section | $x^1$ | $x^1$ | o | o | o | o | o | o | Δ | Δ | $x^2$ |

$x^1$: Macro defects were observed in the signal crystal.
$x^2$: The crystal was made polycrystalline.
Δ: Macro defects in the single crystal disappeared, but the crystal is more or less unstable.
o: Macro defects in the single crystal disappeared.

The invention claimed is:

1. A method for growing a silicon carbide single crystal on a silicon carbide single crystal substrate by contacting the substrate with a solution containing C prepared by heating and melting Si in a graphite crucible, and dissolving C into a melt containing Si from the graphite crucible, comprising:
preparing the solution containing C by dissolving C into the melt that contains Cr and Ce such that a proportion of Cr in a whole composition of the melt is in a range of 40 to 49.5 at. %, and a proportion of Ce in the whole composition of the melt is in a range of 0.5 to 20 at. %; and
growing the silicon carbide single crystal from the solution.

2. The method according to claim 1, wherein the proportion of Cr is in a range of 40 to 49 at. %, and the proportion of Ce is in a range of 1 to 20 at. %.

3. A method for growing a silicon carbide single crystal on a silicon carbide single crystal substrate by contacting the substrate with a solution containing C prepared by heating and melting Si in a graphite crucible, and dissolving C into a melt containing Si from the graphite crucible, comprising:
preparing the solution containing C by dissolving C into the melt that contains Cr and Nd such that a proportion of Cr in a whole composition of the melt is in a range of 37 to 49 at. %, and a proportion of Nd in the whole composition of the melt is in a range of 1 to 25 at. %; and
growing the silicon carbide single crystal from the solution.

4. The method according to claim 3, wherein the proportion of Cr is in a range of 40 to 49 at. %, and the proportion of Nd is in a range of 1 to 20 at. %.

5. A method for growing a silicon carbide single crystal, comprising:
preparing a solution containing C by dissolving C into a melt containing Si, Cr, and Ce in a crucible while heating the crucible; and bringing a silicon carbide single crystal substrate into contact with the solution so as to grow the silicon carbide single crystal on the silicon carbide single crystal substrate, wherein a proportion of Cr in the whole composition of the melt is in a range of 40 to 49.5 at. %, and a proportion of Ce in the whole composition of the melt is in a range of 0.5 to 20 at. %.

6. The method according to claim 5, wherein the proportion of Cr is in a range of 40 to 49 at. %, and the proportion of Ce is in a range of 1 to 20 at. %.

7. The method according to claim 5, wherein the crucible is a graphite crucible.

8. A method for growing a silicon carbide single crystal, comprising:

preparing a solution containing C by dissolving C into a melt containing Si, Cr, and Nd in a crucible while heating the crucible; and bringing a silicon carbide single crystal substrate into contact with the solution so as to grow the silicon carbide single crystal on the silicon carbide single crystal substrate, wherein a proportion of Cr in the whole composition of the melt is in a range of 37 to 49 at. %, and a proportion of Nd in the whole composition of the melt is in a range of 1 to 25 at. %.

9. The method according to claim 8, wherein the proportion of Cr is in a range of 40 to 49 at. %, and the proportion of Nd is in a range of 1 to 20 at. %.

10. The method according to claim 8, wherein the crucible is a graphite crucible.

* * * * *